US012560574B2

(12) United States Patent
Nguyen et al.

(10) Patent No.: US 12,560,574 B2
(45) Date of Patent: Feb. 24, 2026

(54) ELECTROLYTE-BASED FIELD EFFECT TRANSISTOR AND ASSOCIATED METHOD OF FABRICATION

(71) Applicant: COMMISSARIAT À L'ENERGIE ATOMIQUE ET AUX ENERGIES ALTERNATIVES, Paris (FR)

(72) Inventors: Ngoc-Anh Nguyen, Grenoble Cedex (FR); Sami Oukassi, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 638 days.

(21) Appl. No.: 17/858,557

(22) Filed: Jul. 6, 2022

(65) Prior Publication Data

US 2023/0008734 A1     Jan. 12, 2023

(30) Foreign Application Priority Data

Jul. 7, 2021     (EP) .................................... 21184370

(51) Int. Cl.
| | |
|---|---|
| *G01N 27/414* | (2006.01) |
| *H10D 30/01* | (2025.01) |
| *H10D 30/67* | (2025.01) |

(52) U.S. Cl.
CPC ......... *G01N 27/414* (2013.01); *H10D 30/031* (2025.01); *H10D 30/6758* (2025.01)

(58) Field of Classification Search
CPC . G01N 27/414; H10D 30/031; H10D 30/6758
See application file for complete search history.

(56) References Cited

U.S. PATENT DOCUMENTS

| | | | | |
|---|---|---|---|---|
| 4,597,001 A | * | 6/1986 | Bortscheller | ...... H10D 30/0321 257/E21.414 |
| 5,468,989 A | * | 11/1995 | Nishizawa | ........... H10D 10/421 257/E21.375 |

(Continued)

FOREIGN PATENT DOCUMENTS

| | | | |
|---|---|---|---|
| EP | 3 730 933 A1 | 10/2020 | |
| WO | WO 2013/103122 A1 | 7/2013 | |

OTHER PUBLICATIONS

E. J. Fuller, F. E. Gabaly, F. Leonard, S. Agarwal, S. J. Plimpton, R. B. Jacobs-Gedrim, C. D. James, M. J. Marinella, A. A. Talin, "Li-Ion Synaptic Transistor for Low Power Analog Computing", Adv. Mater. 2017, 29, 1604310. (Year: 2017).*

(Continued)

*Primary Examiner* — Lex H Malsawma
*Assistant Examiner* — Sammantha K Salaz
(74) *Attorney, Agent, or Firm* — Pillsbury Winthrop Shaw Pittman LLP

(57)     ABSTRACT

An electrolyte-based field effect transistor includes a dielectric layer; a source electrode and a drain electrode located on top of the dielectric layer; the electrolyte-based transistor further including an electrolyte layer between and on top of the source electrode and the drain electrode, the part of the electrolyte layer located between the source electrode and the drain electrode being in direct contact with the dielectric layer; and a gate electrode on top of the electrolyte layer, the orthogonal projection of the gate electrode in a plane including the source and drain electrodes being located, at least in part, between the source and the drain electrodes.

12 Claims, 9 Drawing Sheets

(56)  References Cited

U.S. PATENT DOCUMENTS

| | | | |
|---|---|---|---|
| 8,130,559 B1 | 3/2012 | Patel et al. | |
| 9,653,159 B2 | 5/2017 | Mccreery et al. | |
| 9,947,379 B1 | 4/2018 | El Gabaly Marquez et al. | |
| 9,989,488 B2 | 6/2018 | Borini et al. | |
| 10,429,343 B1 * | 10/2019 | Talin | H10N 70/883 |
| 10,823,697 B2 | 11/2020 | Ma | |
| 2017/0077151 A1 * | 3/2017 | Kuriki | H10D 86/481 |
| 2019/0165356 A1 | 5/2019 | Li et al. | |
| 2020/0287236 A1 | 9/2020 | Todorov et al. | |

OTHER PUBLICATIONS

Extended European Search Report as issued in European Patent Application No. 21184370.1, dated Jan. 24, 2022.

* cited by examiner

ELECTROLYTE-BASED FIELD EFFECT TRANSISTOR AND ASSOCIATED METHOD OF FABRICATION

CROSS-REFERENCE TO RELATED APPLICATIONS

This application claims priority to European Patent Application No. 21184370.1, filed Jul. 7, 2021, the entire content of which is incorporated herein by reference in its entirety.

FIELD

The technical field of the invention is the one of synaptic transistors.

The invention concerns a synaptic transistor comprising an electrolyte and more precisely an electrolyte-based synaptic transistor.

BACKGROUND

Synaptic transistors are usually based on one of the two following technologies: electric double layer transistor or red-ox transistor.

As illustrated in FIG. 1, an electric double layer transistor comprises a dielectric layer OX, a source electrode S and a drain electrode D located on top of the dielectric layer OX, a semi-conductor layer SC on top of the dielectric layer OX and between the source S and the drain D in which is formed the channel of the transistor. It also comprises, on top of the structure already described an electrolyte layer EC and a gate electrode G on top of the electrolyte layer. When a potential is applied to the gate electrode G, charges will move inside the electrolyte EC and produce an electric field in the semi-conductor layer SC located between the source electrode S and the drain electrode D. The advantages of such a transistor are a wide conductance range, a high on/off ratio and a high endurance. But an electric double layer transistor usually requires a large working voltage or the use of four terminals (the fourth one being a back gate in addition to the source S, drain D and gate G electrodes). An example of such a transistor is given in U.S. Pat. No. 10,823,697 B2.

As illustrated in FIG. 2, a red-ox transistor comprises a dielectric layer OX, a source electrode S and a drain electrode D located on top of the dielectric layer OX, an intercalation layer IM on top of the dielectric layer OX and between the source S and the drain D. It also comprises, on top of the structure already described an electrolyte layer EC and a gate electrode G on top of the electrolyte layer EC. When a potential is applied to the gate electrode G, charges will move inside the electrolyte EC and produce a redox reaction between the electrolyte EC and the intercalation layer IM located between the source electrode S and the drain electrode D. The advantages of such a transistor are a low working voltage and a three terminals structure. But such a red-ox transistor usually has a low conductance range, a low on/off ratio and a low endurance (compared to the electric double layer transistor). An example of such a transistor is given in U.S. Pat. No. 9,653,159 B2.

Therefore, there is a need for a transistor that would possess the advantages of the two types of transistors that were just described but none of their drawbacks.

SUMMARY

According to a first aspect of the invention, this need is satisfied by providing an electrolyte-based field effect transistor comprising:

a dielectric layer;
a source electrode and a drain electrode located on top of the dielectric layer.

The electrolyte-based transistor according to an aspect of the invention further comprises:
a lithium-based solid-state electrolyte layer between and on top of the source electrode and the drain electrode, the part of the electrolyte layer located between the source electrode and the drain electrode being in direct contact with the dielectric layer; and
a gate electrode on top of the electrolyte layer and in direct contact with the electrolyte, the orthogonal projection of the gate electrode in a plane comprising the source and drain electrodes being located, at least in part, between the source and the drain electrodes.

The measures performed on such a transistor have shown that it displays a low working voltage, a high on/off ratio, wide conductance range and a high endurance. Furthermore, it operates in a three terminals configuration structure and with low working voltage.

The transistor according to the first aspect of the invention may also have one or more of the following characteristics, considered individually or according to any technically possible combinations thereof In an embodiment the material of the electrolyte layer comprises lithium phosphorous oxynitride.

In an other embodiment, the lithium-based solid state electrolyte is an oxide solid electrolyte, for instance LiPON, $LI_3PO_4$ or $Li_3PO_xSe_x$.

In an embodiment, the lithium-based solid state electrolyte is a sulfide solid electrolyte, for instance $Li_6PS_5X$ where X is chosen among Cl, Br or I.

In an embodiment, the lithium-based solid state electrolyte is a solid polymer electrolyte, for instance PVA (LiClO$_4$) or PEO (LiClO$_4$).

In an embodiment, the dielectric material of the dielectric layer has an energy band gap higher than 8 eV.

In an embodiment, the distance between the source electrode and the drain electrode is between 1.5 μm and 5 μm.

In an embodiment, the width of the source electrode and the drain electrode (along a direction perpendicular to an axis going through the center of the first electrode and the second electrode) is between 8 μm and 15 μm, and in an embodiment 10 μm.

In an embodiment, the thickness of the source electrode, the drain electrode and/or the gate electrode is between 200 nm and 400 nm, and in an embodiment 300 nm.

In an embodiment, the thickness of the dielectric layer is between 400 nm and 600 nm, and in an embodiment 500 nm.

In an embodiment, the thickness of the electrolyte layer is between 10 nm and 300 nm, and in an embodiment 200 nm.

A second aspect of the invention concerns a spiking neural network comprising a plurality of electrolyte-based field effect transistors according to the invention.

A third aspect of the invention relates to a method for fabricating an electrolyte-based field effect transistor, the method starting from a substrate and comprising:
A step of full-sheet deposition of a dielectric layer on the substrate;
A step of full-sheet deposition of a first conductive layer on the dielectric layer;
A step of patterning the first conductive layer to form a source electrode and a drain electrode in the conductive layer;

A step of full-sheet deposition of an electrolyte layer, the thickness of the electrolyte layer being chosen to cover the source and drain electrodes formed during the preceding step;

A step of deposition of a second conductive layer on the electrolyte layer;

A step of patterning the second conductive layer to form a gate electrode, the orthogonal projection of the gate electrode in a plane comprising the source and drain electrodes being located, at least in part, between the source and the drain electrodes.

In an embodiment, the material of the dielectric layer is the silicon oxide and the step of full-sheet deposition of a dielectric layer on the substrate is implemented using a thermal growth.

BRIEF DESCRIPTION OF THE FIGURES

Other characteristics and benefits of the invention will become clear from the description that is given thereof below, by way of indication and in no way limiting, with reference to the appended figures.

DETAILED DESCRIPTION

For greater clarity, identical or similar elements are marked by identical reference signs in all the figures.

Electrolyte-Based Field Effect Transistor

Figure 1:
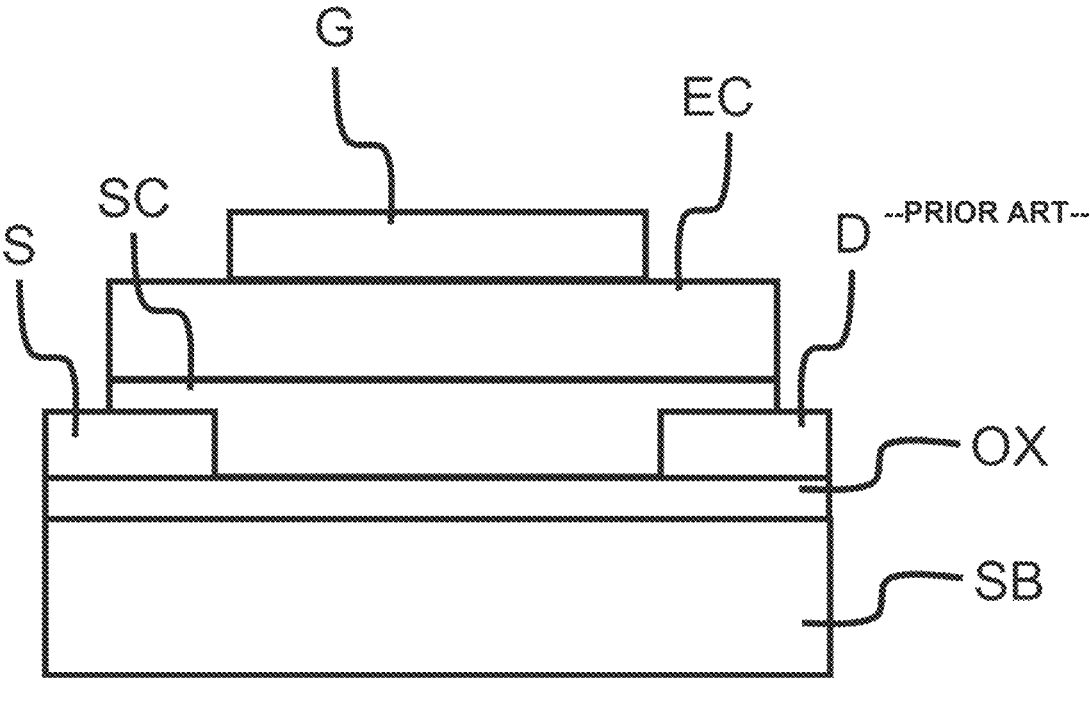
FIG. 1 illustrates an electric double layer transistor of the prior art.
Figure 2:
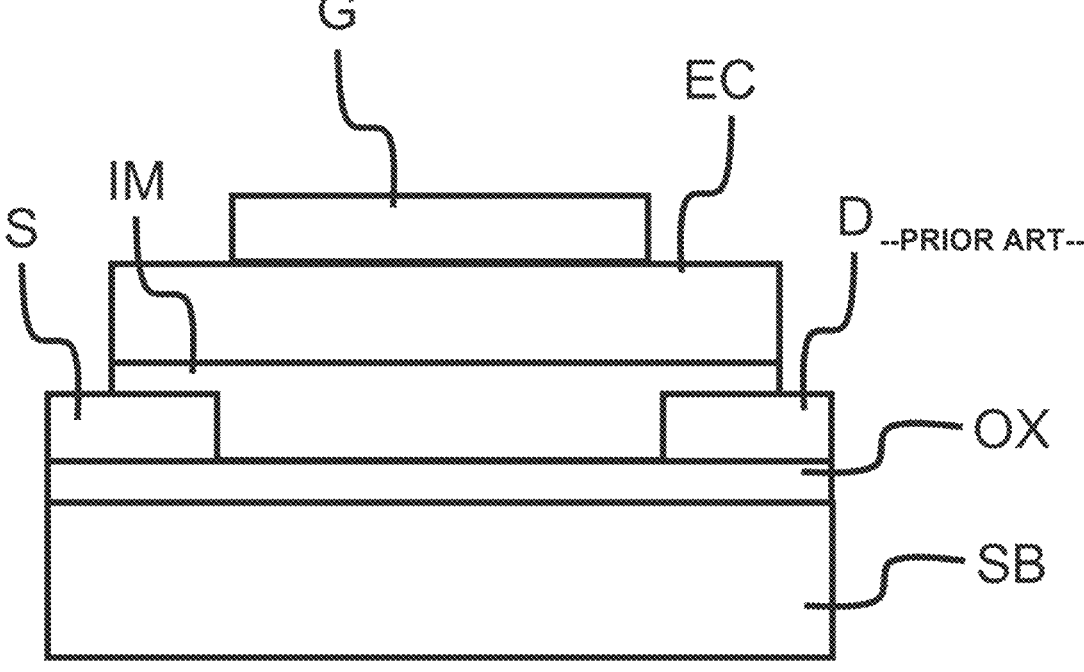
FIG. 2 illustrates a red-ox transistor of the prior art.
Figure 3:
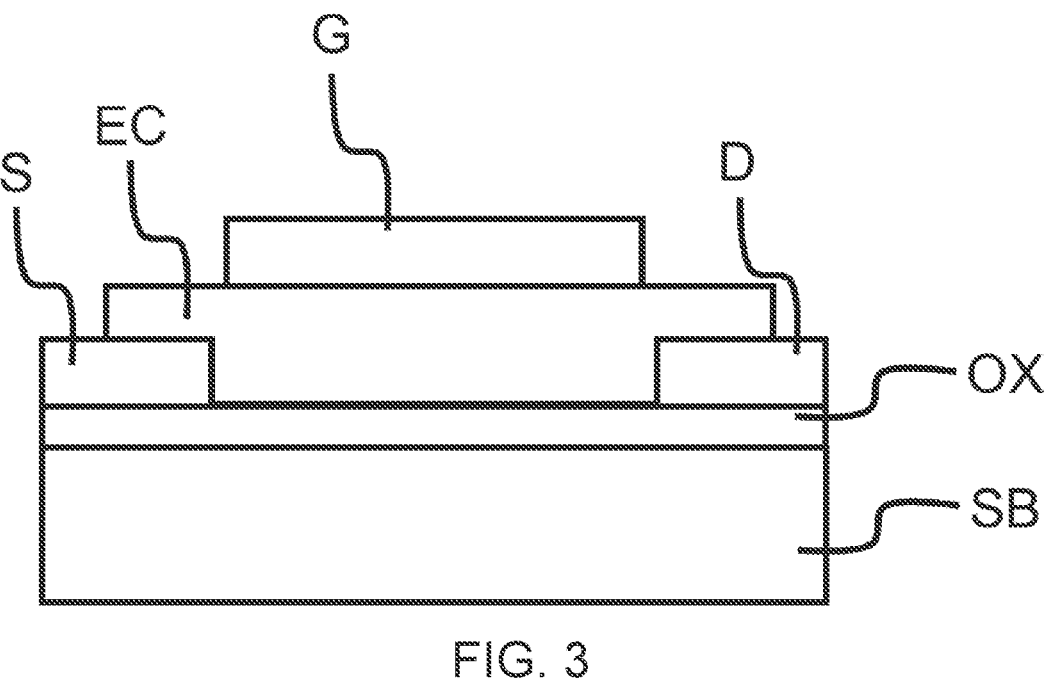
FIGS. 3 to 5 illustrate an electrolyte-based transistor according to an aspect of the invention.
Figure 4:
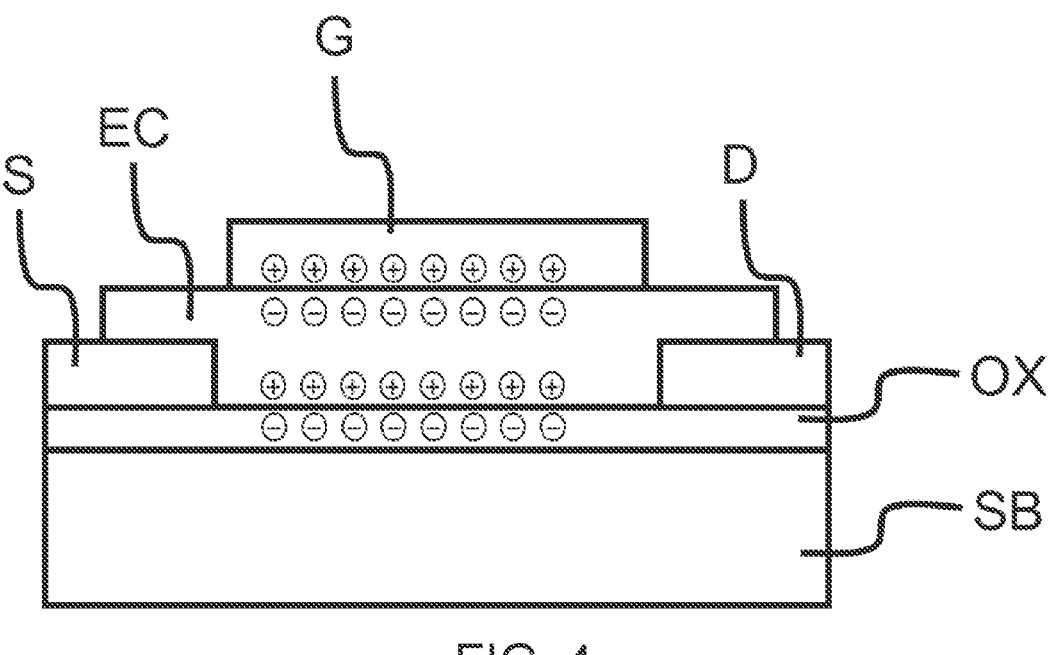
Figure 5:
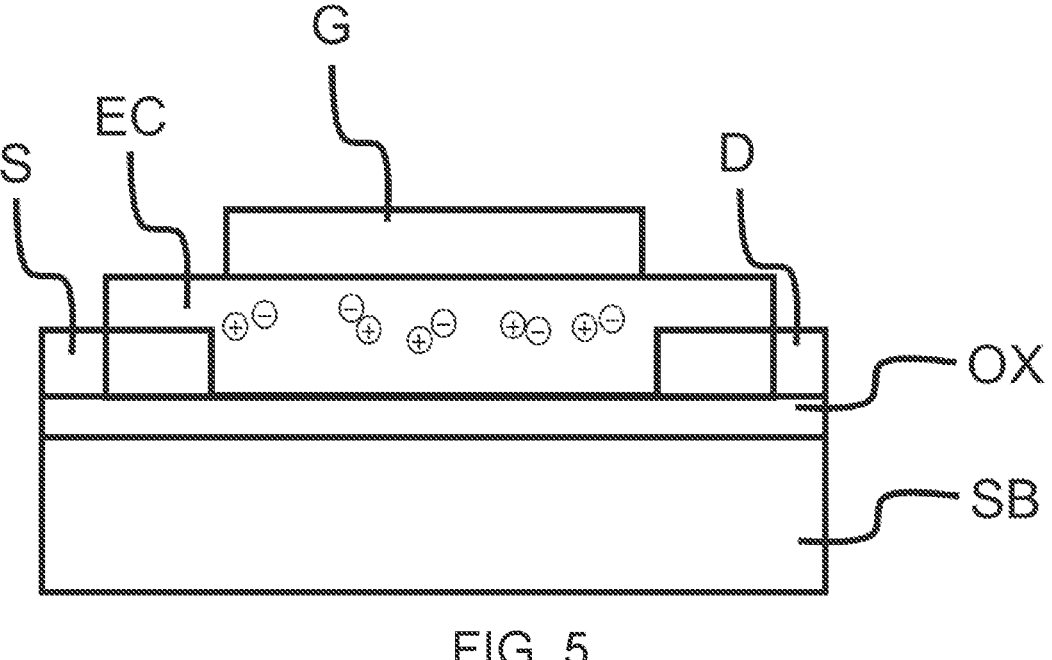

A first aspect of the invention illustrated in FIGS. 3 to 5 concerns an electrolyte-based field effect transistor comprising a dielectric layer OX, a source electrode S and a drain electrode D located on top of the dielectric layer OX. In an embodiment, the dielectric material of the dielectric layer has an energy band gap higher than 8 eV. In an embodiment, the distance between the source electrode S and the drain electrode D is between 1.5 µm and 5 µm. In an embodiment, the width of the source electrode S and the drain electrode D (i.e, measured along a direction perpendicular to an axis going through the center of the source electrode S and the drain electrode D) is between 8 µm and 15 µm, and in an embodiment 10 µm. In an embodiment, the thickness of the dielectric layer OX is between 400 nm and 600 nm, and in an embodiment 500 nm. In an embodiment, the material of the dielectric layer OX comprises $SiO_2$ or any insulating metal oxide such as $Al_2O_3$.

The electrolyte-based transistor according to an aspect of the invention further comprises a lithium-based solid-state electrolyte layer EC between and on top of the source electrode S and the drain electrode D, the part of the electrolyte layer located between the source electrode S and the drain electrode D being in direct contact with the dielectric layer OX. In particular, there is no semi-conductor layer between the source S and the drain D electrodes in the electrolyte-based field effect transistor according to an aspect of the invention. In an embodiment, the electrolyte material of the electrolyte layer EC comprises lithium phosphorous oxynitride. In an embodiment, the thickness of the electrolyte layer EC is comprised between 10 nm and 300 nm, and in an embodiment 200 nm. In an embodiment, when the thickness is not uniform, the thickness of the electrolyte layer EC relates to the thickness of the electrolyte layer EC between the source electrode S and the drain electrode D. In another embodiment, the lithium-based solid state electrolyte is an oxide solid electrolyte (e.g. LiPON, $LI_3PO_4$ or $Li_3PO_xSe_x$), a sulfide solid electrolyte (e.g. $Li_6PS_5X$ where X is chosen among Cl, Br or I) or a solid polymer electrolyte (e.g. PVA ($LiClO_4$) or PEO ($LiClO_4$)).

The electrolyte-based transistor according to an aspect of the invention also comprises a gate electrode G on top of the electrolyte layer EC and in direct contact with the electrolyte layer EC, the orthogonal projection of the gate electrode G in a plane comprising the source electrode S and drain electrode D being located, at least in part, between the source electrode S and the drain electrode D. In an embodiment, the thickness of the source electrode S, the drain electrode D and/or the gate electrode G is between 200 nm and 400 nm, and in an embodiment 300 nm.

As shown in FIG. 4, when a voltage is applied to the gate voltage, charges are formed at the gate/electrolyte interface and at the electrolyte/dielectric interface. Those charges are believed to play a role in the transport properties of the transistor according to the invention. As shown in FIG. 5, when the gate voltage is brought back to zero, the charges vanish. The measures performed on such a transistor (see FIGS. 10 to 13 described later) have shown that it displays a low working voltage, a high on/off ratio, wide conductance range and a high endurance. Furthermore, it operates in a three terminals configuration structure and with low working voltage and can be used in a spiking neural network according to a second aspect of the invention.

Fabrication of an Electrolyte-Based Field Effect Transistor

A third aspect of the invention illustrated in FIGS. 6A-E and FIG. 7 concerns a method 100 for fabricating a elec-trolyte-based field effect transistor, the method starting from a substrate SB.

The method according to an aspect of the invention comprises a step E1 of full-sheet deposition of a dielectric layer OX on the substrate. In an embodiment, the thickness of the dielectric layer OX is between 400 nm and 600 nm, and in an embodiment 500 nm.

This step E1 is followed by a step E2 of full-sheet deposition of a first conductive layer CL on the dielectric layer OX. In an embodiment, the thickness of the conducive layer CL is between 200 nm and 400 nm, and in an embodiment 300 nm.

Figure 6A:
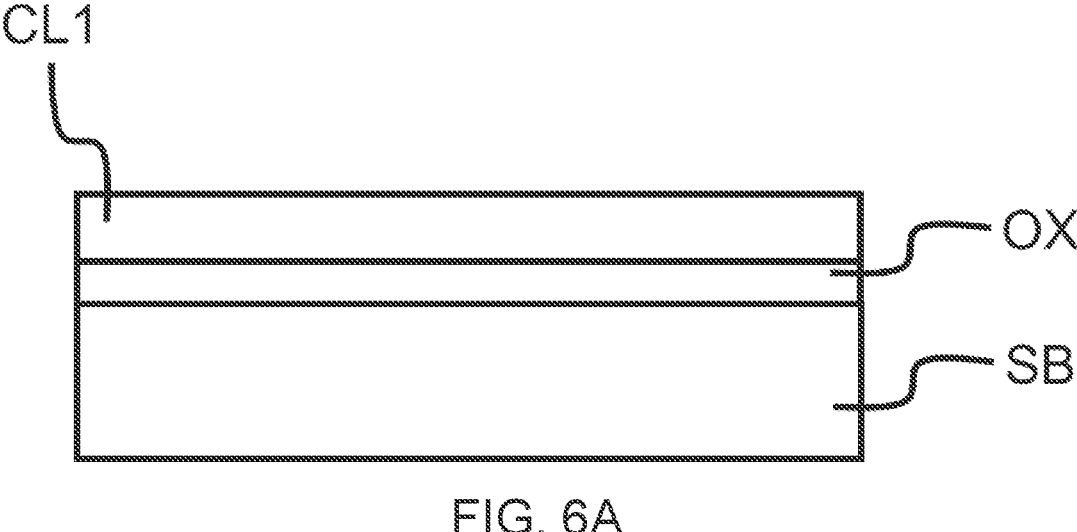
FIGS. 6A to 6E illustrate a method of fabrication according to an aspect of the invention.

The structure obtained after these two steps E1-E2 is illustrated in FIG. 6A.

Figures 6B, 6C:
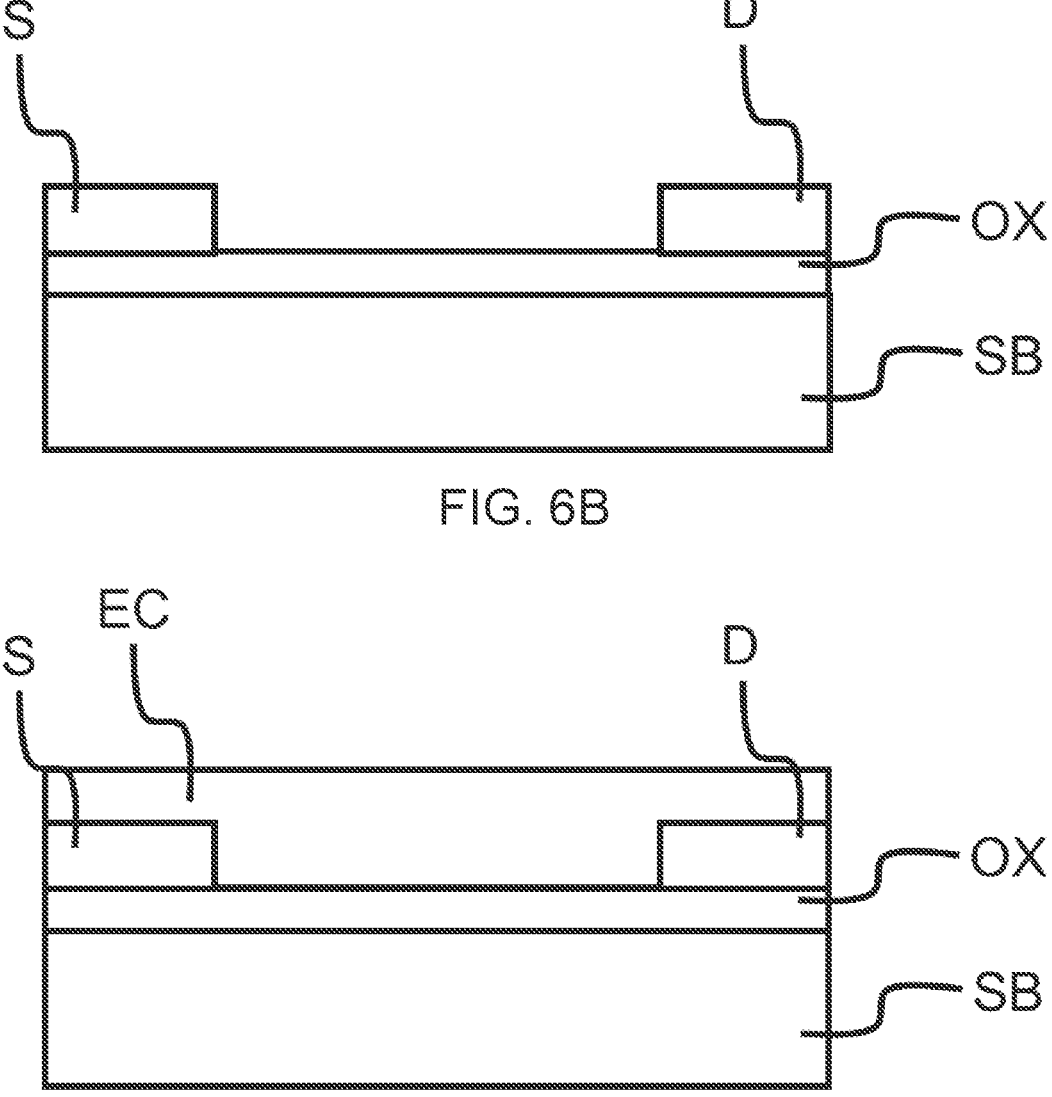

As illustrated in FIG. 6B, the method 100 further comprises a step E3 of patterning the first conductive layer CL to form a source electrode S and a drain electrode D in the conductive layer CL.

As illustrated in FIG. 6C, the method 100 also comprises a step E4 of full-sheet deposition of an electrolyte layer EC, the thickness of the electrolyte layer EC being chosen so as to cover the source S and drain D electrodes formed during the preceding step E3. In an embodiment, the thickness of the electrolyte layer EC is between 10 nm and 300 nm, and in an embodiment 200 nm.

Figure 6D:
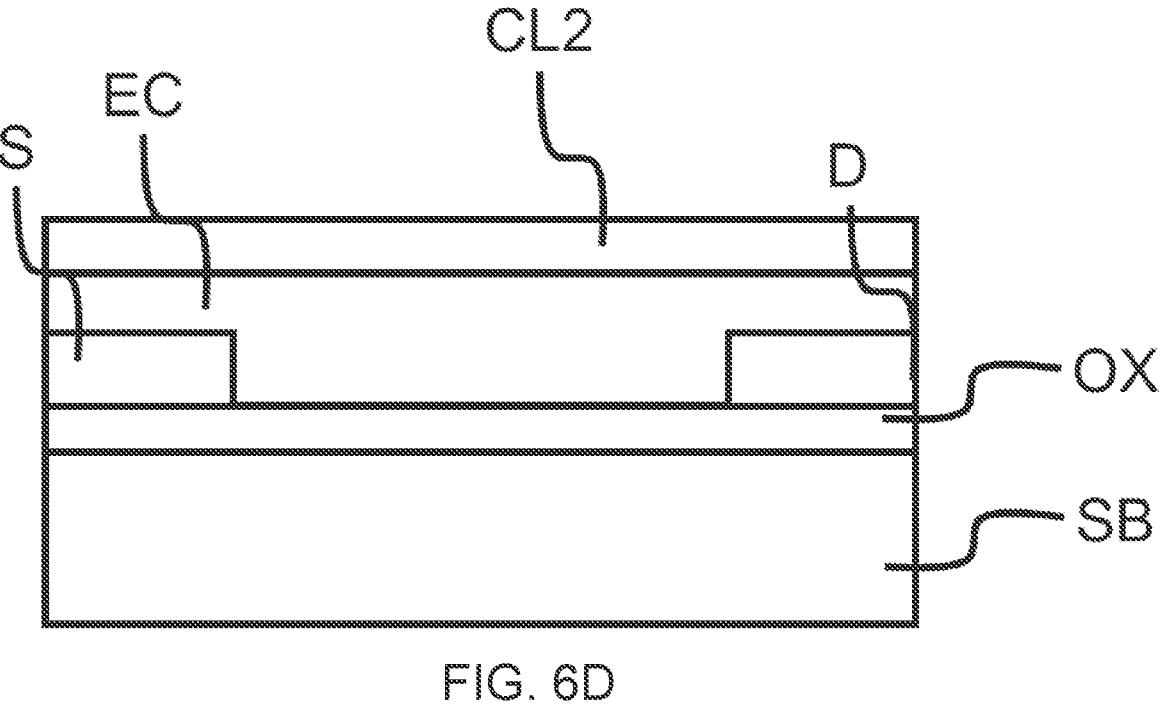

As illustrated in FIG. 6D, the method 100 further comprises a step E5 of deposition of a second conductive layer CL2 on the electrolyte EC. In an embodiment, the thickness of the second conducive layer CL2 is between 200 nm and 400 nm, and in an embodiment 300 nm.

Figure 6E:
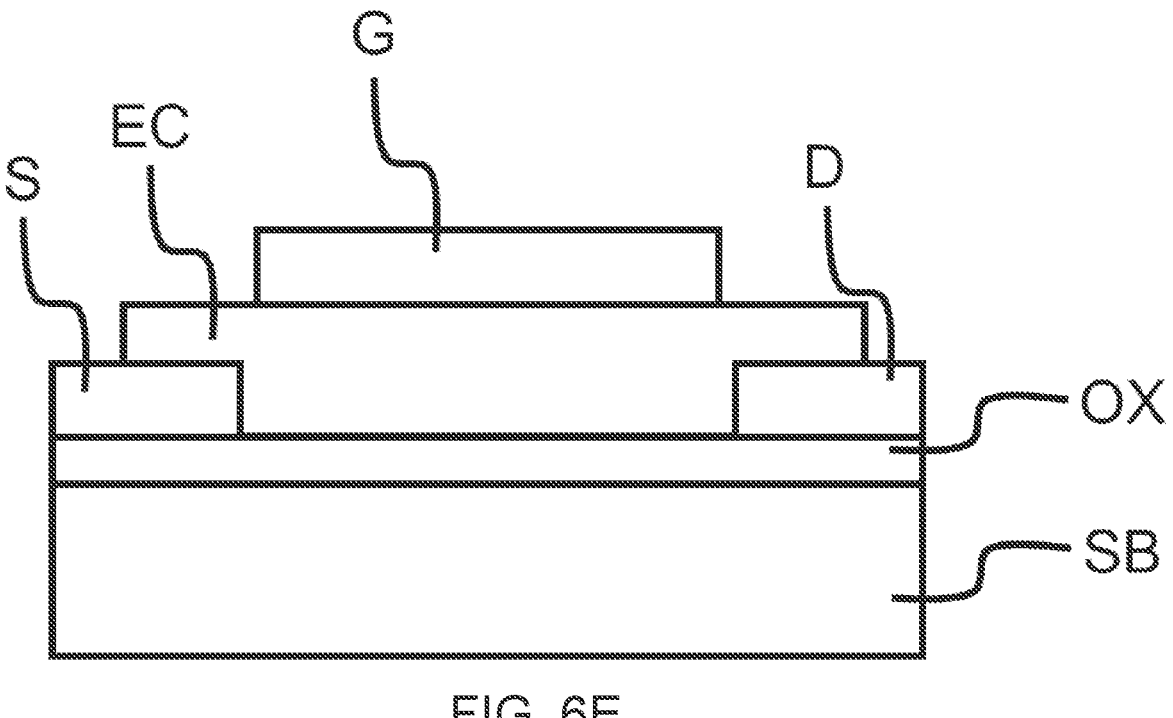
Figure 7:
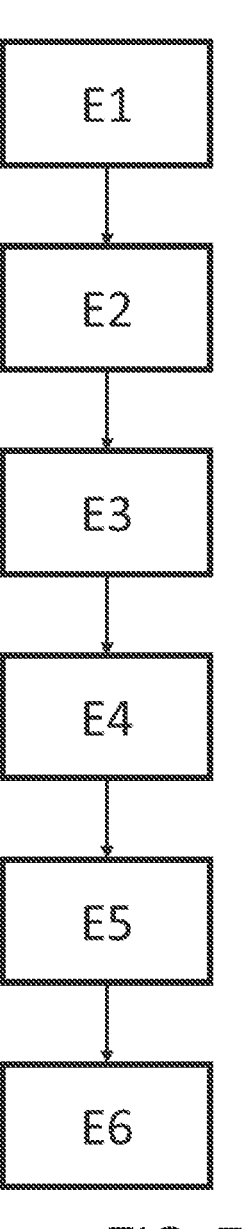
FIG. 7 illustrates a logogram of the method of fabrication according to an aspect of the invention.

As illustrated in FIG. 6E, this step E5 is followed by a step E6 of patterning the second conductive layer CL2 to form a gate electrode G, the orthogonal projection of the gate electrode G in a plane comprising the source electrode S and drain electrode D being located, at least in part, between the source electrode S and the drain electrode D.

Characterization of the Electrolyte-Based Field Effect Transistor

While the underlying mechanism of the current flowing though the transistor according to an aspect of the invention is not fully understood, the inventors were able to verify that it can be used as a transistor, for instance acting as a neuron in a neural network.

Figure 8:
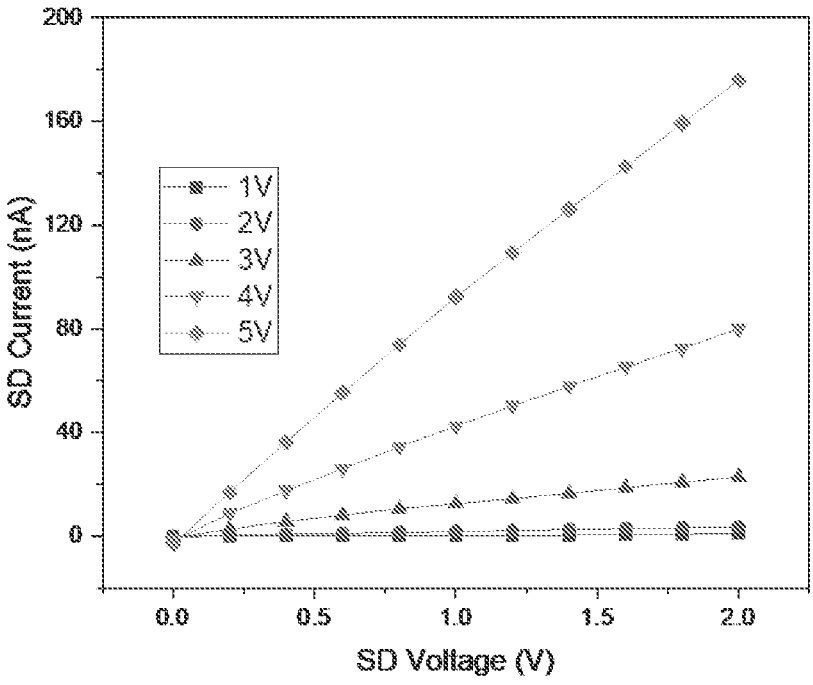
FIG. 8 shows the evolution of the source drain current as a function of the source drain voltage for different value of the gate voltage.

The FIG. 8 shows the evolution of the source drain current as a function of the source drain voltage for different value of the gate voltage (from 1V to 5V).

Figure 9:
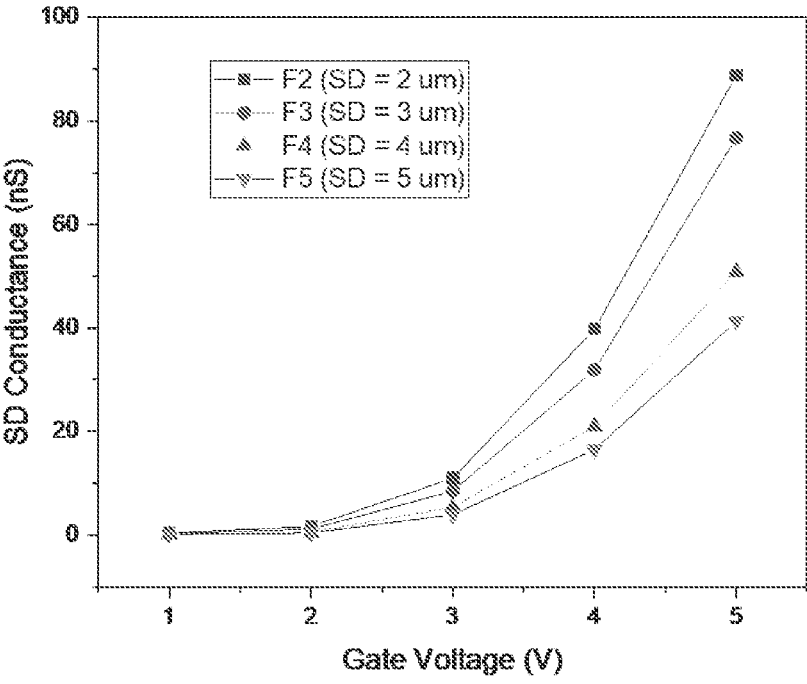
FIG. 9 shows the evolution of the conductance between the source electrode and the drain electrode as a function of the gate voltage for different distance between the source electrode and the drain electrode.

The FIG. 9 shows the evolution of the conductance between the source electrode and the drain electrode as a function of the gate voltage for different distances between the source electrode and the drain electrode. The dependence of the current with respect to the distance between the source electrode and the drain electrode is clearly visible.

Figure 10:
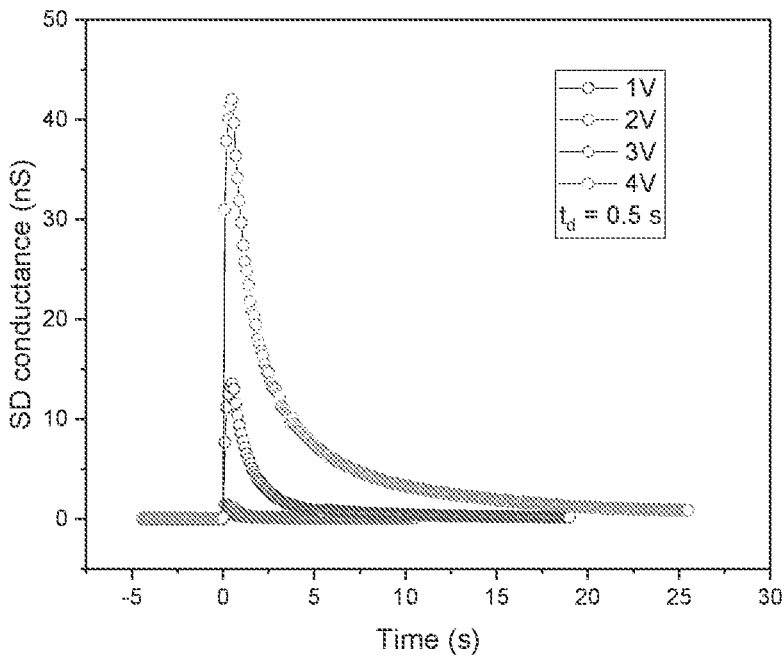
FIG. 10 shows the evolution of the conductance in time after voltage pulses of different amplitude (1V, 2V, 3V and 4V) and a duration of 0.5 second applied to the gate electrode.

The FIG. 10 shows the evolution of the conductance in time after voltage pulses of different amplitude (1 V, 2 V, 3 V and 4 V) and a duration of 0.5 second applied to the gate. The measurement clearly shows a high on/off ratio (up to 525) and a fast relaxation of the conductance after the pulse.

Figure 11:
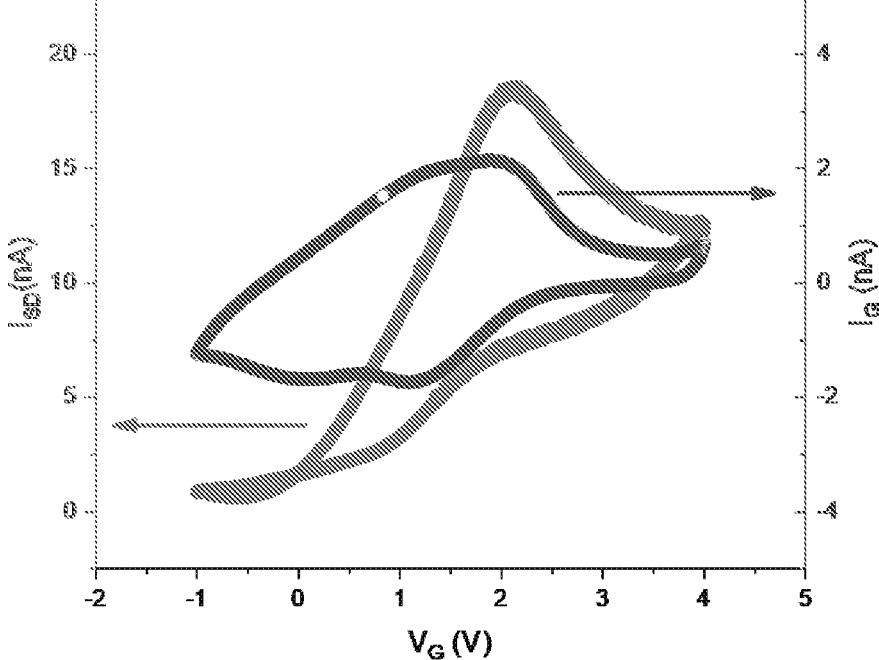
FIG. 11 shows, in light gray the hysteresis of the source-drain current as a function of the gate voltage and, in dark gray the hysteresis of the gate current as a function of the gate voltage.

The FIG. 11 shows, in light gray the hysteresis of the source-drain current as a function of the gate voltage and, in dark gray the hysteresis of the gate current as a function of the gate voltage. The measurement clearly shows the decorrelation between the source-drain current and the gate current.

Figure 12A:
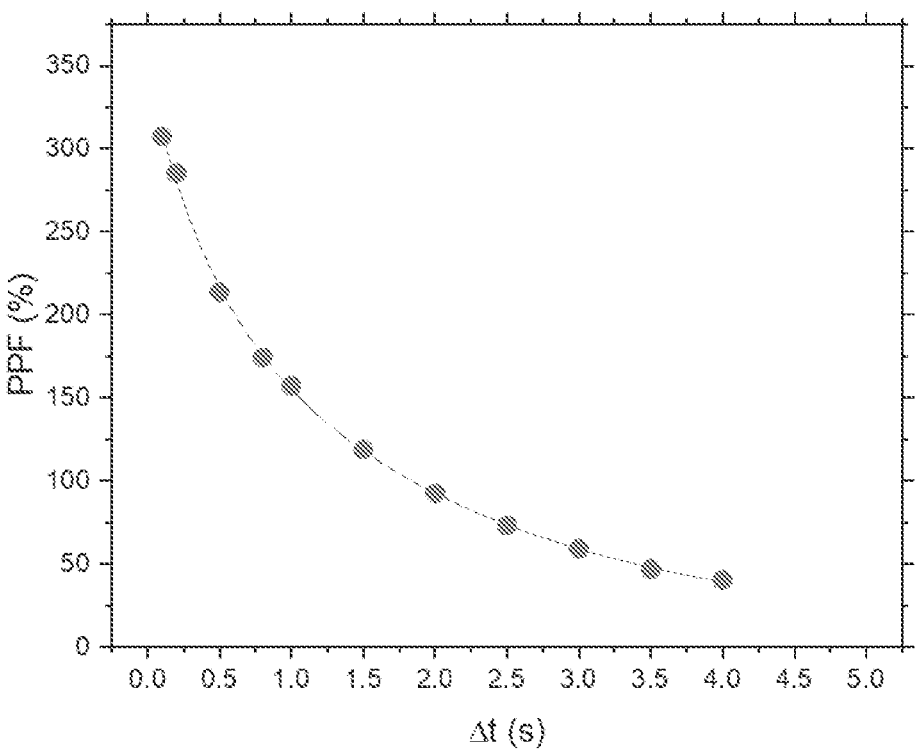
FIG. 12A shows the evolution of the paired-pulse facilitation as a function of the width of the pulse.
Figure 12B:
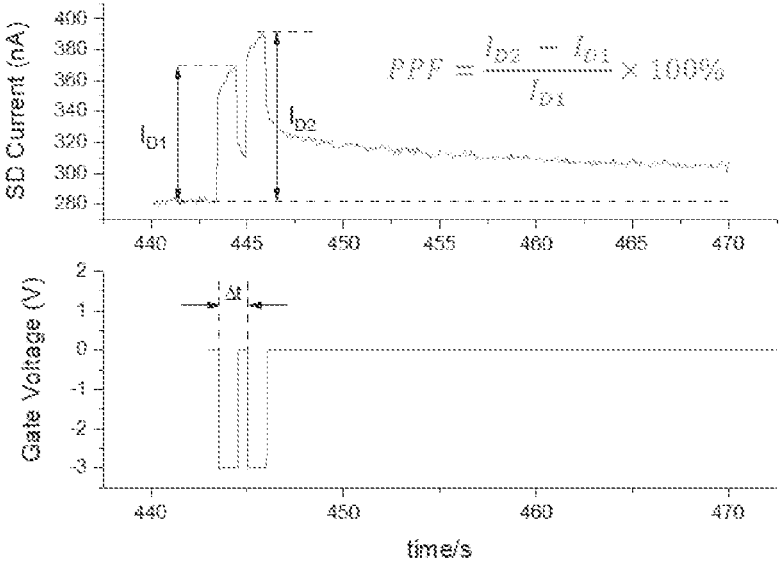
FIG. 12B shows one measurement that allows to extract the PPF for a given pulse width.

The FIG. 12A shows the evolution of the paired-pulse facilitation aka PPF (which corresponds to a synapse property) as a function of the width of the pulse (see FIG. 12B). The FIG. 12B shows one measurement that allows to extract the PPF for a given pulse width. This measurement is known of the skilled person and will not be detailed further.

It is clear from the measurements of FIGS. 8 to 12 that a transistor according to the invention display features that are characteristics of a field effect transistor and that are compatible with the use in emulating the synaptic plasticity.

The invention claimed is:

1. An electrolyte-based field effect transistor comprising:
a dielectric layer;
a source electrode and a drain electrode located on top of the dielectric layer;
a lithium-based solid-state electrolyte layer between and on top of the source electrode and the drain electrode, a part of the lithium-based solid-state electrolyte layer located between the source electrode and the drain electrode being in direct contact with the dielectric layer, and
a gate electrode on top of the lithium-based solid-state electrolyte layer and in direct contact with the electrolyte layer, an orthogonal projection of said gate electrode in a plane comprising the source and drain electrodes being located, at least in part, between the source and the drain electrodes;
wherein the lithium-based solid state electrolyte is an oxide solid electrolyte chosen among LiPON, $Li_3PO_4$ and $Li_3PO_xSe_x$, or is a sulfide solid electrolyte, or is a solid polymer electrolyte.

2. The electrolyte-based field effect transistor according to claim 1, wherein no semi-conductor layer is present between the source electrode and the drain electrode.

3. The electrolyte-based field effect transistor according to claim 1, wherein a dielectric material of the dielectric layer has an energy band gap higher than 8 eV.

4. The electrolyte-based field effect transistor according to claim 1, wherein a distance between the source electrode and the drain electrode is between 1.5 μm and 5 μm.

5. The electrolyte-based field effect transistor according to claim 1, wherein a width of each source electrode and the drain electrode is between 8 μm and 15 μm.

6. The electrolyte-based field effect transistor according to claim 5, wherein the width is 10 μm.

7. The electrolyte-based field effect transistor according to claim 1, wherein a thickness of the source electrode, the drain electrode and/or the gate electrode is between 200 nm and 400 nm.

8. The electrolyte-based field effect transistor according to claim 7, wherein the thickness is 300 nm.

9. The electrolyte-based field effect transistor according to claim 1, wherein a thickness of the dielectric layer is between 400 nm and 600 nm.

10. The electrolyte-based field effect transistor according to claim 9, wherein the thickness is 500 nm.

11. The electrolyte-based field effect transistor according to claim 1, wherein a thickness of a thicker part of the lithium-based solid-state electrolyte layer is between 10 nm and 300 nm.

12. The electrolyte-based field effect transistor according to claim 11, wherein the thickness is 200 nm.

* * * * *